United States Patent
Lee et al.

(10) Patent No.: US 9,875,775 B2
(45) Date of Patent: Jan. 23, 2018

(54) SENSE AMPLIFIER AND INPUT/OUTPUT CIRCUIT OF SEMICONDUCTOR APPARATUS INCLUDING THE SAME

(71) Applicant: SK hynix Inc., Icheon-si, Gyeonggi-do (KR)

(72) Inventors: Yong Sung Lee, Icheon-si (KR); Deok Won Kang, Icheon-si (KR); Jong Su Kim, Icheon-si (KR); Dong Jae Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/193,287

(22) Filed: Jun. 27, 2016

(65) Prior Publication Data
US 2017/0249977 A1    Aug. 31, 2017

(30) Foreign Application Priority Data
Feb. 29, 2016 (KR) .................. 10-2016-0024379

(51) Int. Cl.
*G11C 7/12* (2006.01)
*G11C 7/06* (2006.01)
*G11C 5/14* (2006.01)

(52) U.S. Cl.
CPC .............. *G11C 7/12* (2013.01); *G11C 5/14* (2013.01); *G11C 7/062* (2013.01)

(58) Field of Classification Search
CPC .... G11C 7/08; G11C 7/12; G11C 5/14; G11C 7/062
See application file for complete search history.

(56) References Cited

U.S. PATENT DOCUMENTS

| | | | | |
|---|---|---|---|---|
| 4,943,944 A | * | 7/1990 | Sakui .................. | G11C 7/1006 365/149 |
| 5,402,378 A | * | 3/1995 | Min ....................... | G11C 5/14 365/196 |
| 5,539,701 A | * | 7/1996 | Shimizu ............. | G11C 11/4091 365/202 |

(Continued)

FOREIGN PATENT DOCUMENTS

KR    1020140075363 A    6/2014

OTHER PUBLICATIONS

Translation of Nam (KR1020140075363A), Sense Amplifier and Semiconductor Apparatus Including the Same, 2014. (Patent document Provided in IDS of Jun. 27, 2016).*

*Primary Examiner* — Anthan Tran
*Assistant Examiner* — Mushfique Siddique
(74) *Attorney, Agent, or Firm* — William Park & Associates Ltd.

(57) ABSTRACT

A sense amplifier may be provided. The sense amplifier may include a first switch coupled between any one of a first signal line pair and a first power supply terminal. The sense amplifier may include a second switch coupled between the other one of the first signal line pair and the first power supply terminal. The sense amplifier may include a third switch configured to turn on the first switch depending on a level of the any one of the first signal line pair. The sense amplifier may include a fourth switch configured to turn on the second switch depending on a level of the other one of the first signal line pair.

14 Claims, 6 Drawing Sheets

(56) References Cited

U.S. PATENT DOCUMENTS

| | | | | |
|---|---|---|---|---|
| 5,677,886 A * | 10/1997 | Seo | G11C 7/065 | 365/203 |
| 5,687,123 A * | 11/1997 | Hidaka | G11C 5/14 | 365/174 |
| 5,701,268 A * | 12/1997 | Lee | G11C 7/06 | 365/190 |
| 8,553,484 B2 * | 10/2013 | Kim | G11C 11/4091 | 365/149 |
| 8,873,314 B2 * | 10/2014 | Tomishima | G11C 7/1069 | 365/189.15 |
| 9,401,185 B1 * | 7/2016 | Lim | G11C 7/065 | |
| 2007/0109892 A1 * | 5/2007 | Lee | G11C 7/065 | 365/208 |
| 2007/0159896 A1 * | 7/2007 | Takeuchi | G11C 5/14 | 365/189.09 |
| 2008/0049528 A1 * | 2/2008 | Yang | G11C 7/02 | 365/205 |
| 2008/0074914 A1 * | 3/2008 | Fang | G11C 5/025 | 365/63 |
| 2008/0144420 A1 * | 6/2008 | Xi | G11C 5/147 | 365/226 |
| 2008/0151664 A1 * | 6/2008 | Kim | G11C 7/065 | 365/205 |
| 2011/0103123 A1 * | 5/2011 | Nakaoka | G11C 11/4074 | 365/63 |
| 2011/0158023 A1 * | 6/2011 | Yun | G11C 7/08 | 365/207 |
| 2011/0199808 A1 * | 8/2011 | Yi | G11C 7/062 | 365/72 |
| 2011/0211401 A1 * | 9/2011 | Chan | G11C 7/1048 | 365/189.14 |
| 2012/0051156 A1 * | 3/2012 | Kim | G11C 7/12 | 365/189.09 |
| 2012/0275250 A1 * | 11/2012 | Kim | G11C 11/4091 | 365/203 |
| 2012/0275251 A1 * | 11/2012 | Jin | G11C 7/065 | 365/203 |
| 2014/0003113 A1 * | 1/2014 | Seno | G11C 7/10 | 365/51 |
| 2015/0036444 A1 * | 2/2015 | Seo | G11C 7/065 | 365/210.1 |
| 2015/0155015 A1 * | 6/2015 | Park | G11C 7/12 | 365/189.11 |
| 2015/0187775 A1 * | 7/2015 | Yamamoto | H01L 27/10897 | 365/203 |

* cited by examiner

US 9,875,775 B2

1

SENSE AMPLIFIER AND INPUT/OUTPUT CIRCUIT OF SEMICONDUCTOR APPARATUS INCLUDING THE SAME

CROSS-REFERENCES TO RELATED APPLICATION

The present application claims priority under 35 U.S.C. § 119(a) to Korean application number 10-2016-0024379, filed on Feb. 29, 2016, in the Korean Intellectual Property Office, which is incorporated herein by reference in its entirety.

BACKGROUND

1. Technical Field

Various embodiments generally relate to a semiconductor circuit, and more particularly, to a sense amplifier and an input/output circuit of a semiconductor apparatus including the sense amplifier.

2. Related Art

A semiconductor apparatus may consist of a sense amplifier coupled with input/output lines, and an input/output circuit.

Data transmitted through the input/output lines is sensed and amplified by the sense amplifier, and when a voltage difference, that is, a delta V, of the input/output lines (for example, LIO and LIOB) is a predetermined level or more, the data should be transmitted to a next stage.

Therefore, the more rapidly the voltage difference of the input/output lines becomes a desired level, the more the operating speed of the semiconductor apparatus may increase. For this reason, the role of the sense amplifier can be important.

SUMMARY

In an embodiment, a sense amplifier may be provided. The sense amplifier may include a first switch coupled between any one of a first signal line pair and a first power supply terminal. The sense amplifier may include a second switch coupled between the other one of the first signal line pair and the first power supply terminal. The sense amplifier may include a third switch configured to turn on the first switch depending on a level of the any one of the first signal line pair. The sense amplifier may include a fourth switch configured to turn on the second switch depending on a level of the other one of the first signal line pair.

In an embodiment, an input/output circuit of a semiconductor apparatus may be provided. The input/output circuit of a semiconductor apparatus may include a first sense amplifier configured to sense a voltage difference of a bit line pair. The input/output circuit of a semiconductor apparatus may include a first switching circuit configured to couple the bit line pair and a segment line pair according to a first switching control signal. The input/output circuit of a semiconductor apparatus may include a second sense amplifier configured to perform amplification of a voltage difference of the segment line pair at the same time as when the bit line pair and the segment line pair are coupled with each other according to the first switching control signal.

In an embodiment, a sense amplifier may be provided. The sense amplifier may include a control circuit configured to generate a control signal depending on a voltage level of

2 a first signal line pair. The sense amplifier may include a driver configured to drive, according to the control signal, any one of a second signal line pair to a level of a first power supply terminal. The sense amplifier may include a driver precharge circuit configured to precharge, according to a precharge signal, the control signal to the level of the first power supply terminal.

DETAILED DESCRIPTION

Hereinafter, embodiments will be described below with reference to the accompanying drawings.

Various embodiments may be directed to a sense amplifier capable of stable and rapid data transmission, and an input/output circuit of a semiconductor apparatus including the same.

Figure 1:
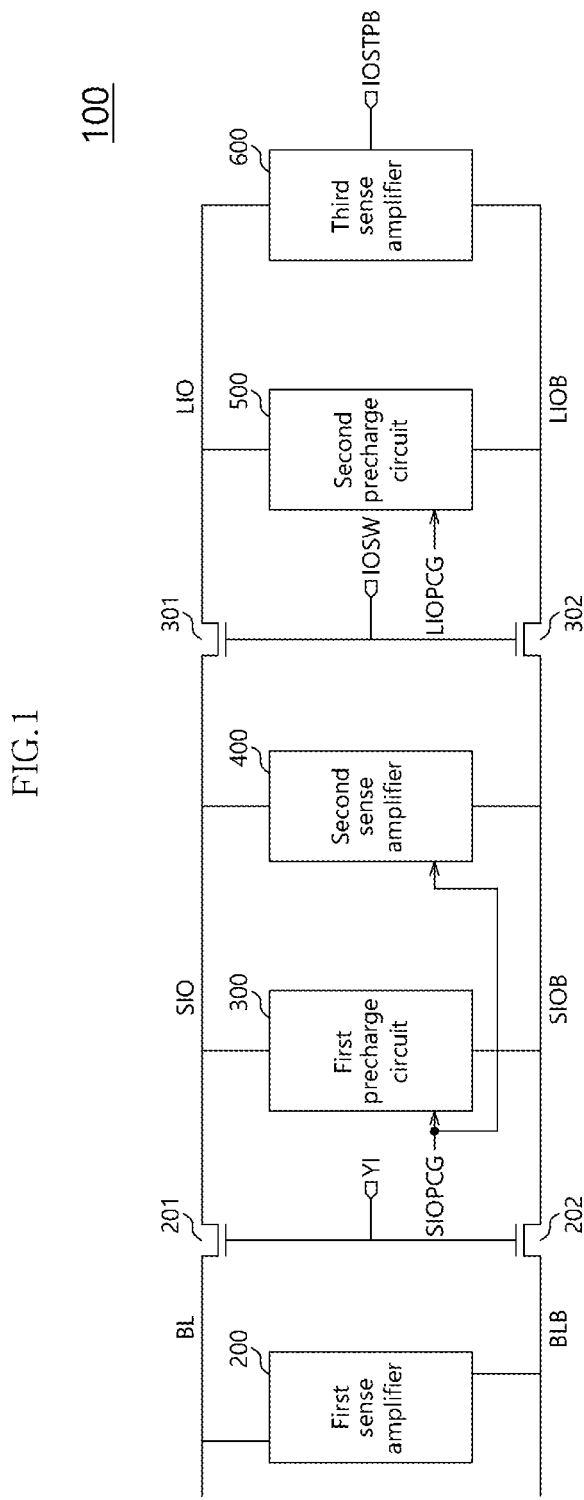
FIG. 1 is a diagram illustrating an example of a representation of the configuration of an input/output circuit 100 of a semiconductor apparatus in accordance with an embodiment.

Referring to FIG. 1, an input/output circuit 100 of a semiconductor apparatus according to an embodiment may include first to third sense amplifiers 200, 400 and 600, first and second precharge circuits 300 and 500, a first switching circuit 201 and 202, and a second switching circuit 301 and 302.

The first sense amplifier 200 may be coupled between a bit line pair BL/BLB, that is, a bit line BL and a bit bar line BLB.

The first sense amplifier 200 may sense and amplify a voltage difference of the bit line pair BL/BLB.

The first switching circuit 201 and 202 may couple the bit line pair BL/BLB and a segment line pair SIO/SIOB, that is, a segment line SIO and a segment bar line SIOB according to a first switching control signal YI, that is, a column select signal.

The first switching circuit 201 and 202 may include a first switch 201 and a second switch 202.

The first switch 201 may include a source to which the bit line BL is coupled, a drain to which a segment line SIO is coupled, and a gate to which the first switching control signal YI is inputted.

The second switch 202 may include a source to which the bit bar line BLB is coupled, a drain to which a segment bar line SIOB is coupled, and a gate to which the first switching control signal YI is inputted.

The first precharge circuit 300 may be coupled between the segment line pair SIO/SIOB.

The first precharge circuit 300 may precharge, according to a segment line precharge signal SIOPCG, the segment line SIO and the segment bar line SIOB to a predetermined level.

The second sense amplifier 400 may be coupled between a first signal line pair, for example, the segment line pair SIO/SIOB, that is, the segment line SIO and the segment bar line SIOB.

The second sense amplifier 400 may perform amplification of a voltage difference of the segment line pair SIO/SIOB at the same time as when the bit line pair BL/BLB and the segment line pair SIO/SIOB are coupled according to the first switching control signal YI.

The second sense amplifier 400 may precharge, according to the segment line precharge signal SIOPCG, an internal control node related to the voltage difference amplification of the segment line pair SIO/SIOB, to a set level. This will be described later herein with reference to FIG. 2.

The second switching circuit 301 and 302 may couple, according to a second switching control signal IOSW, the segment line pair SIO/SIOB and a second signal line pair, for example, a local line pair LIO/LIOB, with each other.

The second switching circuit 301 and 302 may include a first switch 301 and a second switch 302.

The first switch 301 may include a source to which the segment line SIO is coupled, a drain to which a local line SIO is coupled, and a gate to which a second switching control signal IOSW is inputted.

The second switch 302 may include a source to which the segment bar line SIOB is coupled, a drain to which a local bar line LIOB is coupled, and a gate to which the second switching control signal IOSW is inputted.

The second precharge circuit 500 may precharge, according to a local line precharge signal LIOPCG, the local line LIO and the local bar line LIOB to a predetermined level.

The third sense amplifier 600 may be coupled between the local line pair LIO/LIOB, that is, a local line LIO and a local bar line LIOB.

The third sense amplifier 600 may sense a voltage difference of the local line pair LIO/LIOB according to a strobe signal IOSTBP.

Figure 2:
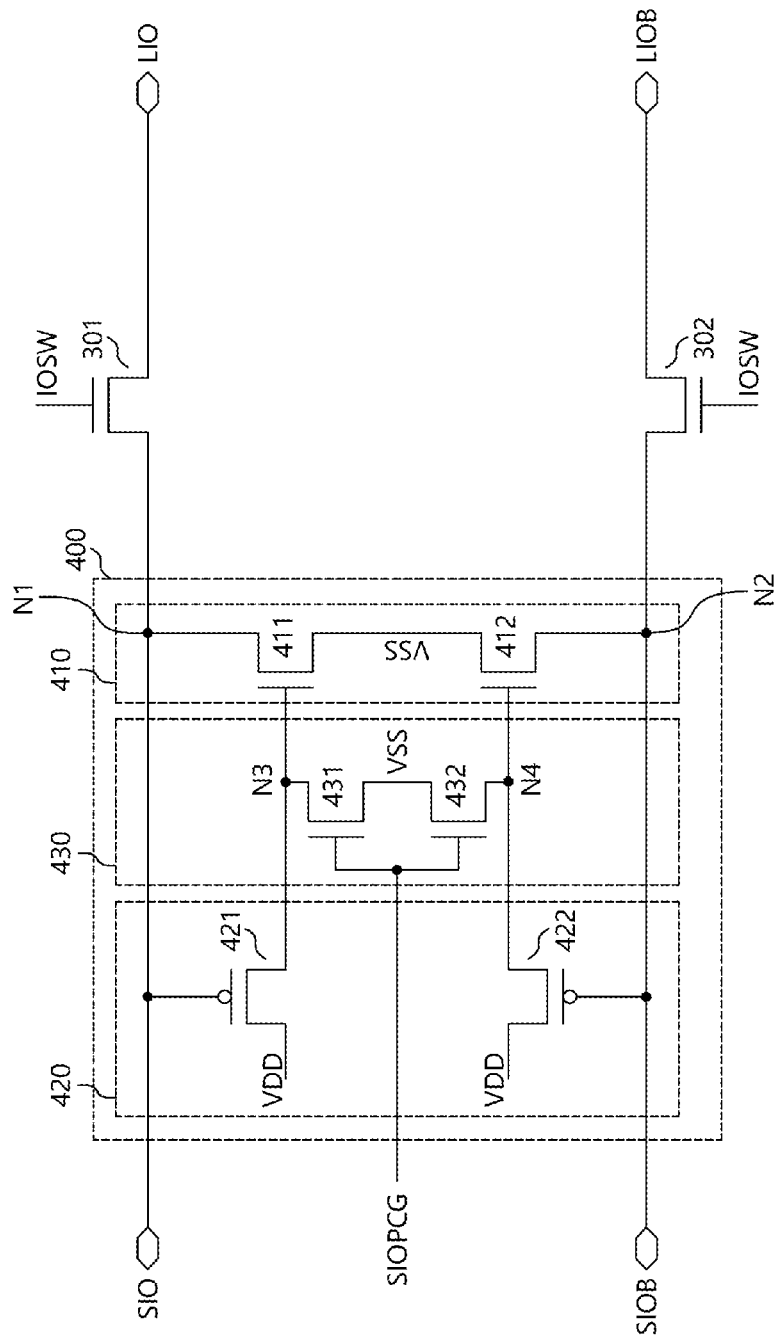
FIG. 2 is a diagram illustrating an example of a representation of the configuration of a second sense amplifier 400 of FIG. 1.

Referring to FIG. 2, the second sense amplifier 400 may sense and amplify a voltage difference of the segment line pair SIO/SIOB and transmit it to the local line pair LIO/LIOB, at the same time as when the bit line pair BL/BLB and the segment line pair SIO/SIOB are coupled according to the first switching control signal YI.

The second sense amplifier 400 may include a driver 410, a control circuit 420 and a driver precharge circuit 430.

The driver 410 may drive, according to control signals N3 and N4, any one of the local line pair LIO/LIOB to the level of a first power supply terminal, for example, the level of a ground terminal VSS.

The driver 410 may include a first switch 411 and a second switch 412 which are coupled between the segment line SIO and the segment bar line SIOB.

Each of the first switch 411 and the second switch 412 may be configured by an NMOS (N-type metal-oxide-semiconductor) transistor.

The first switch 411 may include a source which is coupled with a first node N1 between the segment line SIO and the first switch 301 of the second switching circuit 301 and 302, and a drain which is coupled with the ground terminal VSS.

The second switch 412 may include a source which is coupled with a second node N2 between the segment bar line SIOB and the second switch 302 of the second switching circuit 301 and 302, and a drain which is coupled with the ground terminal VSS.

The control circuit 420 may generate control signals N3 and N4 according to the voltage level of the segment line pair SIO/SIOB.

The control circuit 420 may include a third switch 421 and a fourth switch 422.

The third switch 421 may include a gate coupled with the segment line SIO, a source coupled with a power supply terminal VDD, and a drain coupled with a gate of the first switch 411.

The fourth switch 422 may include a gate coupled with the segment bar line SIOB, a source coupled with the power supply terminal VDD, and a drain coupled with the gate of the first switch 412.

The driver precharge circuit 430 may precharge, according to the segment line precharge signal SIOPCG, the control signals N3 and N4 to the ground terminal level VSS.

The driver precharge circuit 430 may include fifth and sixth switches 431 and 432 that are respectively coupled with the first switch 411 and the second switch 412.

The fifth switch 431 may include a source coupled with the ground terminal VSS, a drain coupled with the gate of the first switch 411 through a first control node N3, and a gate to which the segment line precharge signal SIOPCG is inputted.

The sixth switch 432 may include a source coupled with the ground terminal VSS, a drain coupled with a gate of the second switch 412 through a second control node N4, and a gate to which the segment line precharge signal SIOPCG is inputted.

The operation of the second sense amplifier 400 will be described with reference to FIGS. 3a and 3b.

Figure 3A:
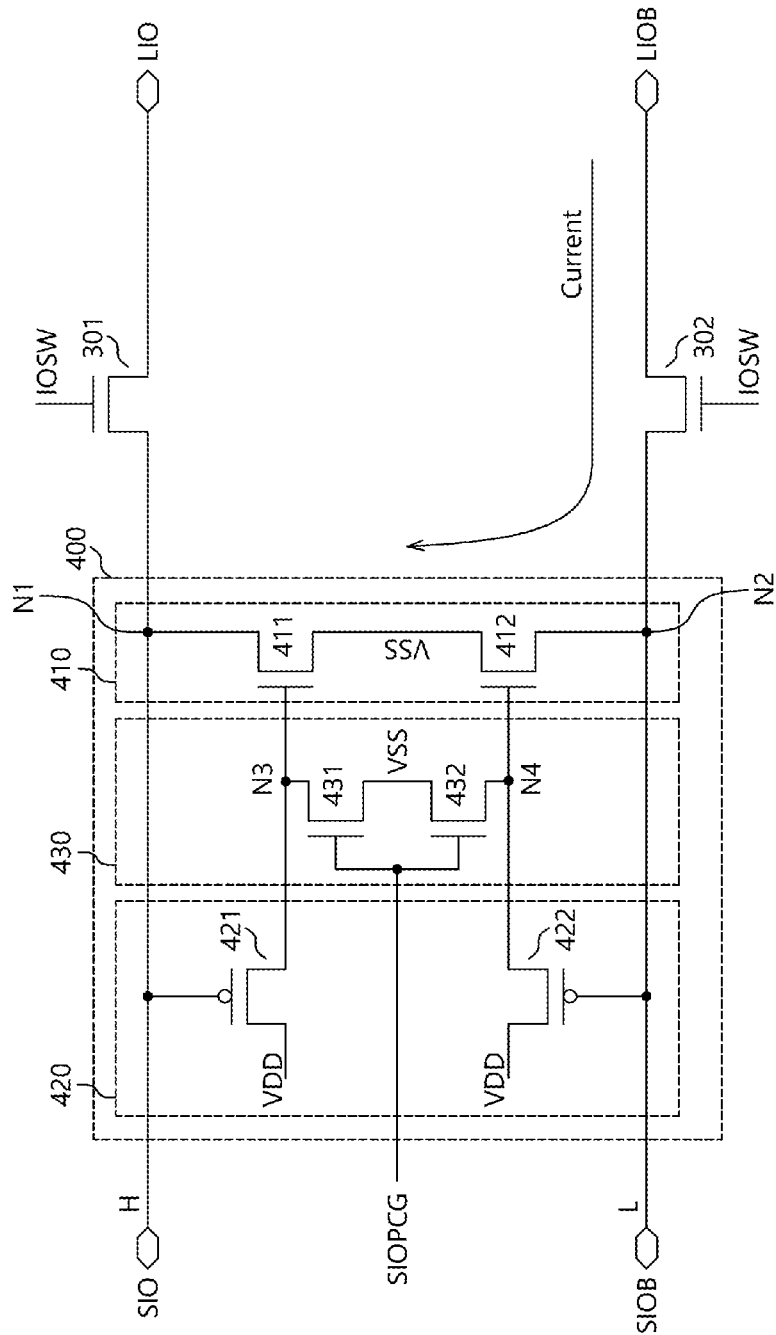
FIGS. 3a and 3b are diagrams for describing examples of the operation of the second sense amplifier 400 of FIG. 2.

First, referring to FIG. 3a, it is assumed that the segment line SIO is a high level, and the segment bar line SIOB is a low level.

In this case, the gates of the first and second switches 411 and 412 are in a state in which they are precharged to the level of the ground terminal VSS by the fifth and sixth switches 431 and 432.

Since the segment line SIO is the high level, the third switch 421 may be turned off. Since the segment bar line SIOB is the low level, the fourth switch 422 may be turned on.

Because the third switch 421 is turned off, the gate of the first switch 411 is maintained in the precharge level, that is, the low level, whereby the first switch 411 may be maintained in the turn-off state.

On the other hand, because the fourth switch 422 is turned on, the level of the power supply terminal VDD is applied to the gate of the second switch 412, so that the second switch 412 may be turned on.

In this case, the local line LIO and the local bar line LIOB are in a state in which they are precharged to the high level by the second precharge circuit 500.

If the second switching control signal IOSW is enabled to the high level, current flows from the local bar line LIOB to the ground terminal VSS via the second switch 302 of the second switching circuit 301 and 302, whereby the local bar line LIOB may be transited to the low level.

Figure 3B:
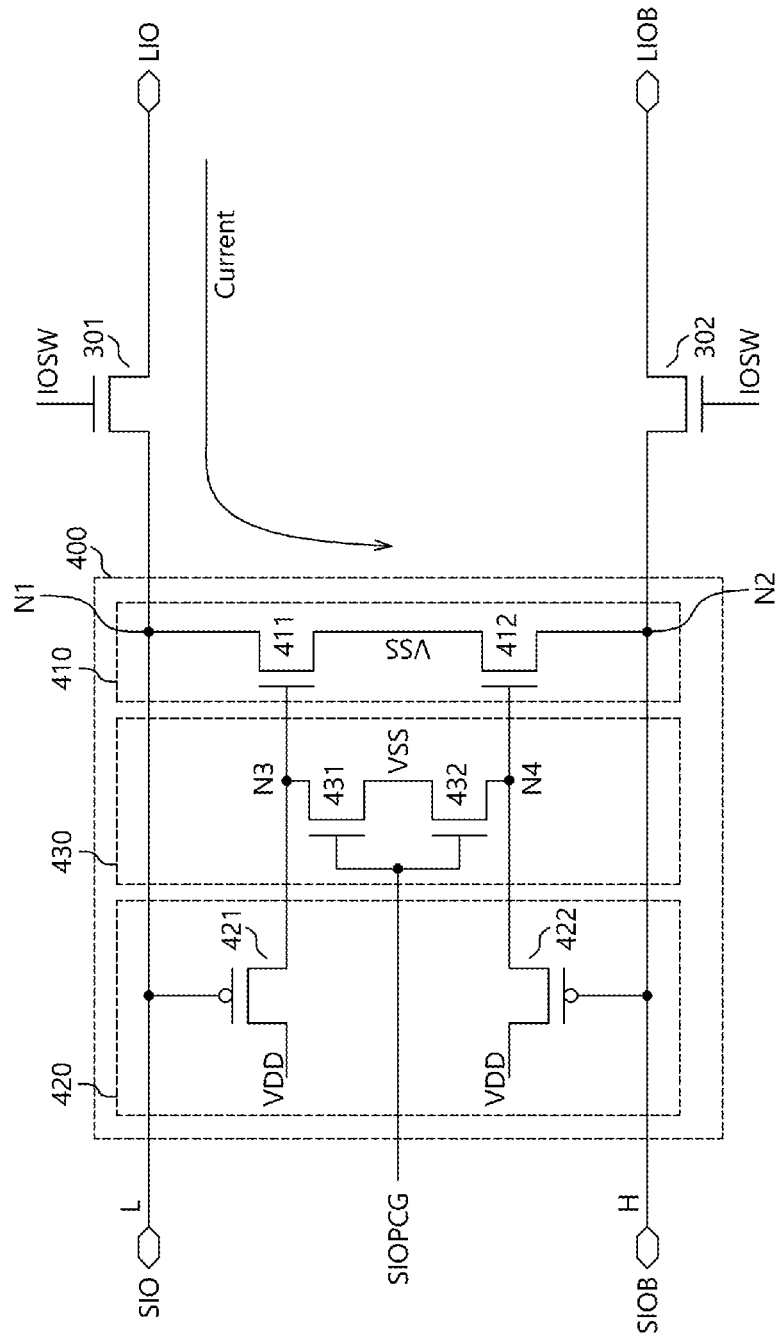

Next, referring to FIG. 3b, it is assumed that the segment line SIO is the low level, and the segment bar line SIOB is the high level.

In this case, the gates of the first and second switches 411 and 412 are in a state in which they are precharged to the level of the ground terminal VSS by the fifth and sixth switches 431 and 432.

Since the segment line SIO is the low level, the third switch 421 may be turned on. Since the segment bar line SIOB is the high level, the fourth switch 422 may be turned off.

Because the third switch 421 is turned on, the level of the power supply terminal VDD is applied to the gate of the first switch 411, so that the first switch 411 may be turned on.

On the other hand, because the fourth switch 422 is turned off, the gate of the second switch 412 is maintained in the precharge level, that is, the low level, whereby the second switch 412 may be maintained in the turn-off state.

In this case, the local line LIO and the local bar line LIOB are in a state in which they are precharged to the high level by the second precharge circuit 500.

If the second switching control signal IOSW is enabled to the high level, current flows from the local line LIO to the ground terminal VSS via the first switch 301 of the second switching circuit 301 and 302, whereby the local line LIO may be transited to the low level.

Figure 4:
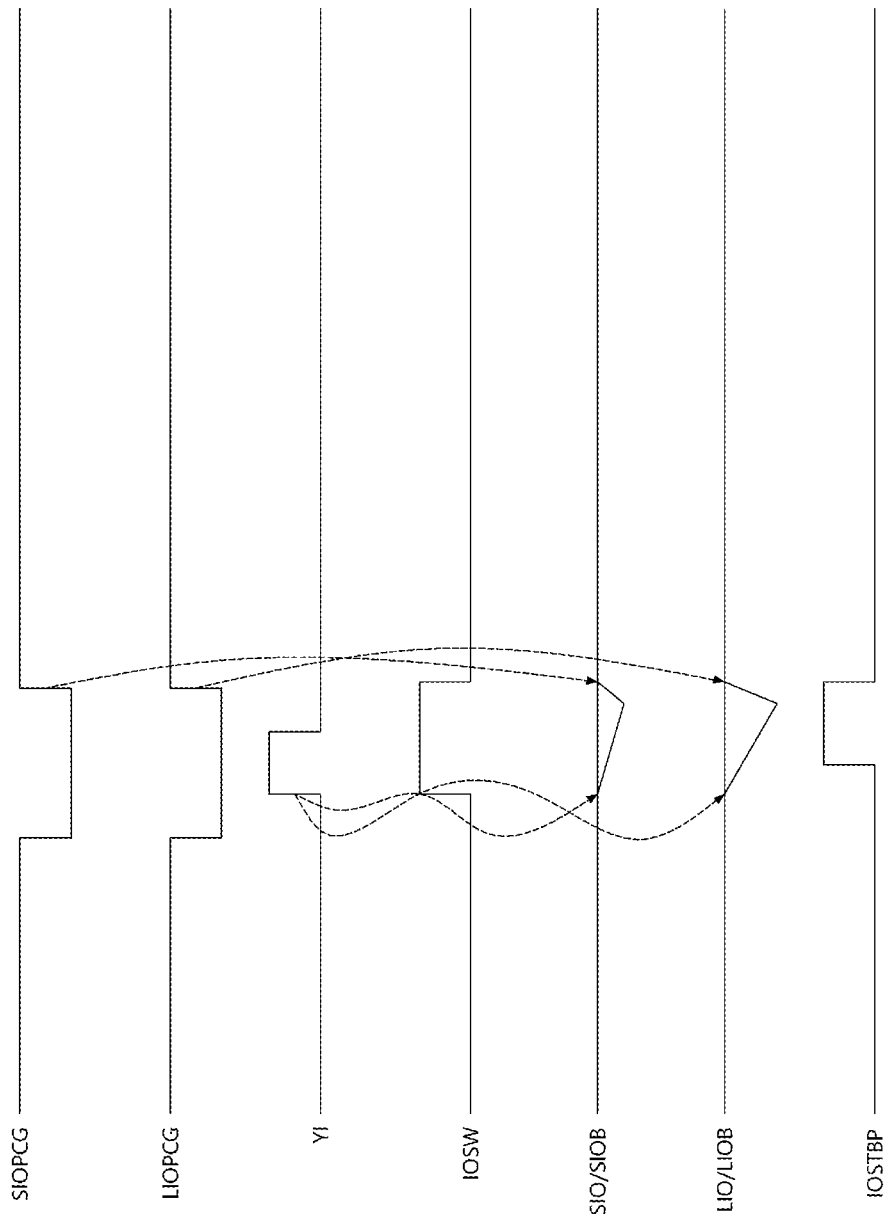
FIG. 4 is an operation timing diagram example of an input/output circuit 100 of a semiconductor apparatus in accordance with an embodiment.

The operation of the input/output circuit 100 according to an example of an embodiment will be described with reference to FIG. 4.

During a period in which the segment line precharge signal SIOPCG and the local line precharge signal LIOPCG are at high levels, the segment line pair SIO/SIOB and the local line pair LIO/LIOB are precharged to the high level.

In this case, referring to FIG. 3a, the gates of the first and second switches 411 and 412 of the second sense amplifier 400 are in a state in which they are precharged, in response to the segment line precharge signal SIOPCG, to the level of the ground terminal VSS by the fifth and sixth switches 431 and 432.

The segment line precharge signal SIOPCG is changed to the low level, and after a predetermined time has passed, the first switch control signal YI and the second switching control signal IOSW may be enabled.

At the same time as when the first switching control signal YI is enabled and thus the bit line pair BL/BLB and the segment line pair SIO/SIOB are coupled with each other, a voltage difference of the segment line pair SIO/SIOB is sensed and amplified by the second amplifier 400, and because the second switching control signal IOSW is in the enabled state, the amplified voltage difference of the segment line pair SIO/SIOB may be transmitted to the local line pair LIO/LIOB.

That is, it may be understood that the voltage differences of the segment line pair SIO/SIOB and the local line pair LIO/LIOB are increased at the same time.

After a preset time has passed, the strobe signal IOSTBP may be enabled.

The preset time may be a time during which the voltage difference of the local line pair LIO/LIOB increase to a desired value or more so that the stable operation of the third sense amplifier 600 is secured.

As the strobe signal IOSTBP is enabled, the third sense amplifier 600 may senses the voltage difference of the local line pair LIO/LIOB.

In an embodiment, because the second sense amplifier 400 is operated simultaneously with enabling of the first switching control signal YI, without a separate control signal, a desired voltage difference of the local line pair LIO/LIOB is rapidly secured, so that the time it takes to enable the strobe signal IOSTBP may be reduced.

Because the time it takes to enable the strobe signal IOSTBP may be reduced, the input/output circuit 100 according to an embodiment may rapidly perform a data input/output operation.

Figure 5:
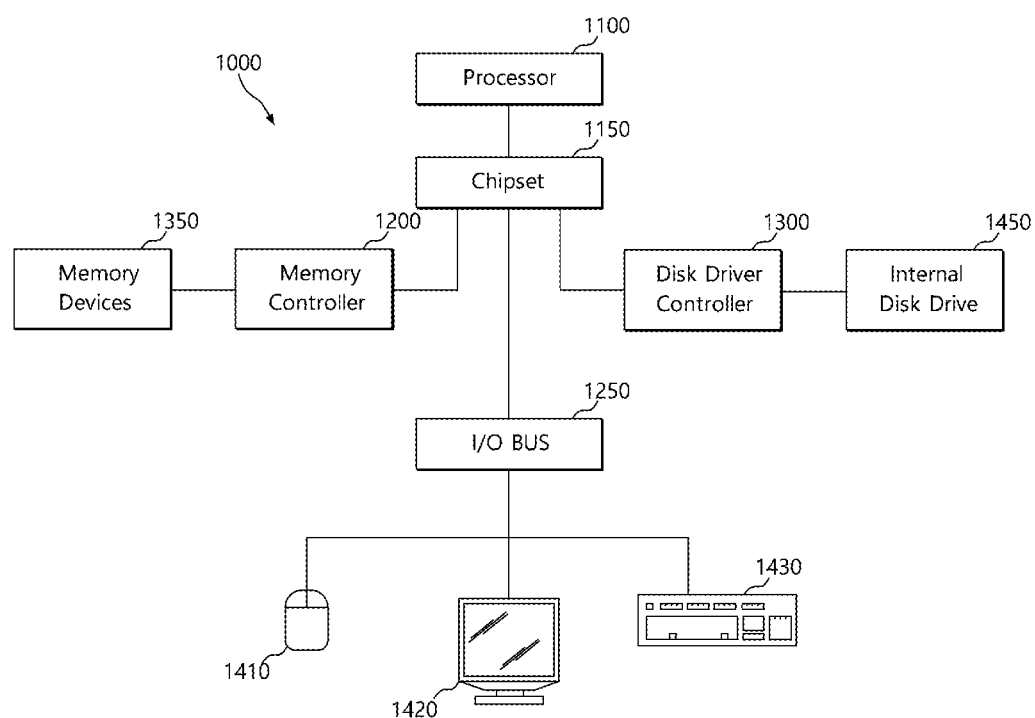
FIG. 5 illustrates a block diagram of an example of a representation of a system employing a sense amplifier and or input/output circuit of a semiconductor device including a sense amplifier with the various embodiments discussed above with relation to FIGS. 1-4.

The sense amplifiers and or input/output circuits of a semiconductor device including a sense amplifier as discussed above (see FIGS. 1-4) are particular useful in the design of memory devices, processors, and computer systems. For example, referring to FIG. 5, a block diagram of a system employing a sense amplifier and or input/output circuit of a semiconductor device including a sense amplifier in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one sense amplifier and or input/output circuit of a semiconductor device including a sense amplifier as discussed above with reference to FIGS. 1-4. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one sense amplifier and or input/output circuit of a semiconductor device including a sense amplifier as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 5 is merely one example of a sense amplifier and or input/output circuit of a semiconductor device including a sense amplifier as discussed above with relation to FIGS. 1-4. In alternate embodiments, such as, for example but not limited to, cellular phones or digital cameras, the components may differ from the embodiments illustrated in FIG. 5.

While certain embodiments have been described above, it will be understood to those skilled in the art that the embodiments described are by way of example only. Accordingly, the sense amplifier and the input/output circuit including the same described herein should not be limited based on the described embodiments. Rather, the sense amplifier and the input/output circuit including the same described herein should only be limited in light of the claims that follow when taken in conjunction with the above description and accompanying drawings.

What is claimed is:

1. A sense amplifier comprising:
 a first switch coupled between a first power supply terminal and any one of a first signal line pair;
 a second switch coupled between the first power supply terminal and the other one of the first signal line pair;
 a third switch configured to turn on the first switch by coupling a second power supply terminal to the first switch depending on a level of the any one of the first signal line pair; and
 a fourth switch configured to turn on the second switch by coupling the second power supply terminal to the second switch depending on a level of the other one of the first signal line pair,
 wherein the third and fourth switches are directly coupled to the second power supply terminal.

2. The sense amplifier of claim 1, wherein the first signal line pair is a segment line pair coupled with a bit line pair.

3. The sense amplifier of claim 2, wherein the sense amplifier is coupled between the segment line pair and a switching circuit for coupling the segment line pair and a local line pair.

4. The sense amplifier of claim 1, wherein the first switch comprises a source coupled with any one of the first signal line pair, and a drain coupled with the first power supply terminal.

5. The sense amplifier of claim 4, wherein the second switch comprises a source coupled with the other one of the first signal line pair, and a drain coupled with the first power supply terminal.

6. The sense amplifier of claim 4, wherein the third switch comprises a gate coupled with the any one of the first signal line pair, a source coupled with a second power supply terminal, and a drain coupled with a gate of the first switch.

7. The sense amplifier of claim 4, wherein the fourth switch comprises a gate coupled with the other one of the first signal line pair, a source coupled with a second power supply terminal, and a drain coupled with a gate of the second switch.

8. The sense amplifier of claim 1, further comprising:
 a fifth switch and a sixth switch configured for precharging gates of the first and second switches to predetermined levels according to a precharge signal.

9. The sense amplifier of claim 1,
 wherein the first switch is configured by an N-type metal-oxide-semiconductor (NMOS) transistor, and
 wherein the second switch is configured by an NMOS transistor.

10. An input/output circuit of a semiconductor apparatus, comprising:
 a first sense amplifier configured to sense a voltage difference of a bit line pair;
 a first switching circuit configured to couple the bit line pair and a segment line pair according to a first switching control signal; and
 a second sense amplifier configured to perform amplification of a voltage difference of the segment line pair, in response to a level variation of the segment line pair according to a coupling of the bit line pair and the segment line pair,
 wherein the second sense amplifier comprises:
 a first switch comprising a source coupled with a segment line of the segment line pair, and a drain coupled with a ground terminal;
 a second switch comprising a source coupled with a segment bar line of the segment line pair, and a drain coupled with the ground terminal;
 a third switch comprising a gate coupled with the segment line, a source coupled with a power supply terminal, and a drain coupled with a gate of the first switch; and
 a fourth switch comprising a gate coupled with the segment bar line, a source coupled with the power supply terminal, and a drain coupled with a gate of the second switch.

11. The input/output circuit of claim 10, further comprising:
 a precharge circuit configured to precharge the segment line pair to a predetermined level according to a segment precharge signal.

12. The input/output circuit of claim 11, wherein the second sense amplifier is configured to precharge, according to the segment precharge signal, a control node related to the amplification of the voltage difference of the segment line pair, to a predetermined level.

13. The input/output circuit of claim 10, further comprising:
 a second switching circuit configured to couple the segment line pair and a local line pair according to a second switching control signal.

14. The input/output circuit of claim 10, further comprising:
 a fifth switch and a sixth switch configured for precharging the gates of the first and second switches to predetermined levels according to a segment precharge signal.

* * * * *